United States Patent
Henker et al.

(10) Patent No.: US 7,420,406 B2
(45) Date of Patent: Sep. 2, 2008

(54) METHOD AND CIRCUIT ARRANGEMENT FOR SETTING AN INITIAL VALUE ON A CHARGE-STORAGE ELEMENT

(75) Inventors: Stephan Henker, Nossen (DE); René Schueffny, Coswig (DE)

(73) Assignee: Infineon Technologies AG, Munich (DE)

( * ) Notice: Subject to any disclaimer, the term of this patent is extended or adjusted under 35 U.S.C. 154(b) by 386 days.

(21) Appl. No.: 11/248,594

(22) Filed: Oct. 12, 2005

(65) Prior Publication Data
US 2006/0231866 A1    Oct. 19, 2006

(30) Foreign Application Priority Data
Oct. 12, 2004    (DE)    ......................    10 2004 049 769

(51) Int. Cl.
*H03K 3/42*    (2006.01)
*H03K 17/78*    (2006.01)
*H01L 31/00*    (2006.01)

(52) U.S. Cl. ...................................................... 327/514
(58) Field of Classification Search ................ 257/514; 327/514

See application file for complete search history.

(56) References Cited

U.S. PATENT DOCUMENTS 6,797,935 B2 *    9/2004    Kaya et al. ................ 250/214.1
7,196,726 B2 *    3/2007    Kokubun et al. ............ 348/308

* cited by examiner

*Primary Examiner*—Evan Pert
(74) *Attorney, Agent, or Firm*—Slater & Matsil, L.L.P.

(57) ABSTRACT

A method is provided for setting an initial value on a charge-storage element. A circuit includes at least one charge-storage element with at least one signal node coupled to at least one reset circuit that is associated with the charge-storage element. A diode can be included between the charge-storage element and the reset circuit. Initially, an initial potential is applied to the at least one signal node during a setting phase by connecting the at least one signal node to the initial potential. A rest potential can then be applied to the signal node during a subsequent holding phase.

20 Claims, 4 Drawing Sheets

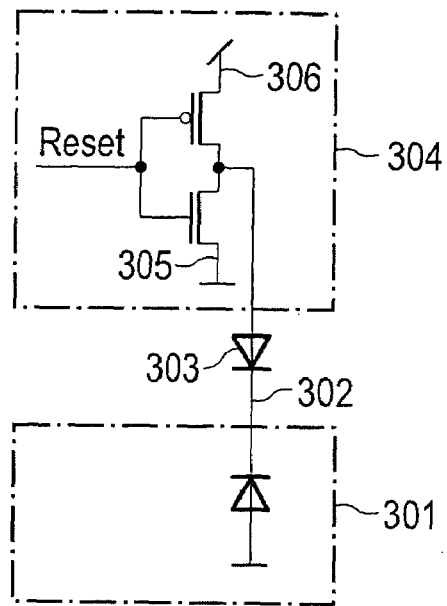
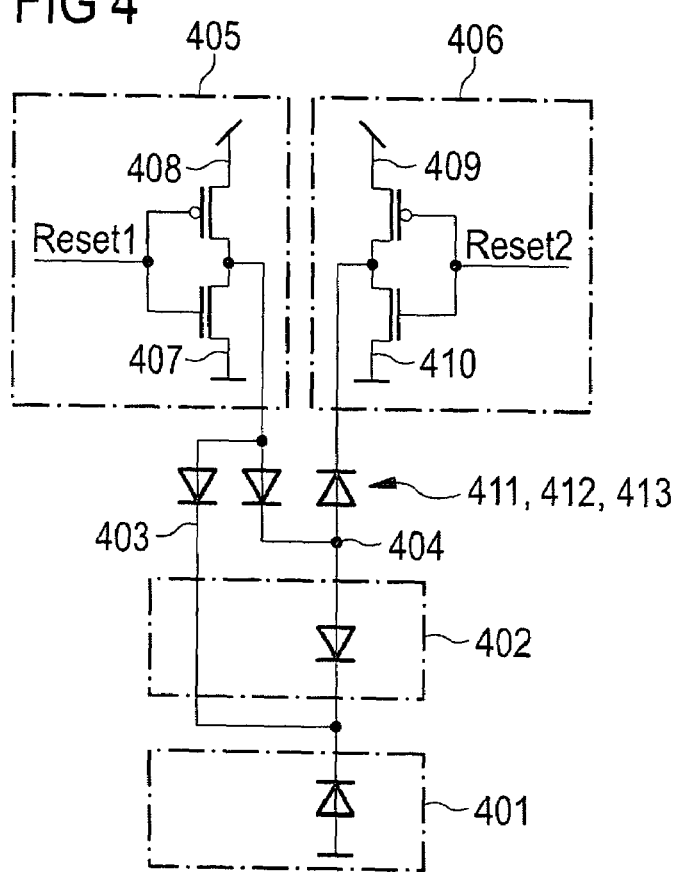

METHOD AND CIRCUIT ARRANGEMENT FOR SETTING AN INITIAL VALUE ON A CHARGE-STORAGE ELEMENT

This application claims priority to German Patent Application 10 2004 049 769.9, which was filed Oct. 12, 2004, and is incorporated herein by reference.

TECHNICAL FIELD

The invention relates generally to electronic circuits and in particular embodiments to a method and circuit arrangement for setting an initial value on a charge-storage element.

BACKGROUND

According to the prior art as illustrated in FIG. 1, a signal node 101 of a charge-storage element 100 is connected directly to a reset circuit 102 which normally comprises a single switch 103. In the phase in which the signal node is intended to be set to an initial value, the connection of the reset circuit 102 is connected with a low impedance to a voltage potential 104, by closing the switch 103.

In the other phase, the holding phase, the connection of the reset circuit is connected with a high impedance to a voltage potential 104 by opening the switch 103. During the holding phase, the voltage potential 104 can be varied as required. The impedance of the reset circuit 102 must be sufficiently high during the holding phase to avoid the voltage potential 104 reacting with the signal node 101.

The switch 103 can normally be provided by means of a transistor. One disadvantageous characteristic of a transistor is, however, that currents, so-called off-state currents or leakage currents, still flow into and out of the transistor connections even in the switched-off state.

If the switch 103 in the reset circuit 102 is formed by a transistor, the impedance of the reset circuit 102 will in some circumstances not be sufficiently high owing to the unavoidable off-state and leakage currents in the holding phase.

U.S. Pat. No. 5,854,498, which is incorporated herein by reference, describes a pixel sensor, in which the 1/f noise is reduced and the voltage range is increased, and the cell size is reduced. The threshold voltage is essentially overcome by using a reset diode and, in contrast to a reset transistor, this cannot be significantly influenced by the 1/f noise.

SUMMARY OF THE INVENTION

Embodiments of the invention relate to a method for setting an initial value on charge-storage elements, which comprise at least one charge-storage element with at least one connection, referred to in the following text as a signal node, as well as at least one reset circuit, which is associated with a charge-storage element, for resetting the charge-storage element. Other embodiments relate to a circuit arrangement for carrying out the method.

In one aspect, the invention provides a method and a circuit arrangement for setting the initial value of a charge-storage element, in which the reset circuit has greater impedance in the holding phase.

In a first embodiment method, an initial potential is first applied to each signal node during a setting phase. This signal node is coupled to an initial potential, and a rest potential is applied to the signal node during a subsequent holding phase.

In one refinement of the method, if there are a plurality of signal nodes located alongside one another in a predetermined sequence, an initial potential followed by a rest potential is first of all, in each case, applied to two adjacent signal nodes, with the initial potential followed by the rest potential then being applied to the next adjacent signal node, which has not been preset, with the application of the initial and rest potentials being continued until the last signal node is at the rest potential.

In another embodiment, a circuit arrangement includes at least one connection of the charge-storage element in the form of photodiodes and is connected to one connection of at least one diode and the other connection of the at least one diode is connected to a reset circuit, forming a signal node.

A further refinement of the invention is characterized in that the reset circuit in each case contains at least two switches, which are connected by one connection to the diode-side connection of the reset circuit, and by another connection to an initial potential or to a rest potential.

One expedient development of the invention provides for the switches in the reset circuits to be in the form of transistors.

As already described, disturbances at the signal node during the holding phase are caused mainly by two effects. These disturbances are firstly so-called off-state or leakage currents that result from the components (of its transistors) used having finite impedances, with disturbances secondly being caused by capacitive couplings, which are generally referred to as clock breakthrough. These disturbances are completely overcome by embodiments of the invention.

The characteristics of the diode during the setting phase allow charge transfer in the forward direction through the diode toward the signal node, which sets the desired value at the storage element, while the diode is reversed-biased in the holding phase.

The impedance of a reverse-biased diode is in this case sufficiently high in order to prevent disturbances resulting, for example, from transistor leakage currents. The impedance of this arrangement is, however, not sufficient, since disturbances can be injected directly into the signal node via the depletion layer capacitance of the diode.

Suitable choice of the reset circuit, for example the capability to adjust the potentials for the setting phase and holding phase externally, in conjunction with the method according to embodiments of the invention, allows the digital and analogue domains to be separated, and makes it possible to prevent disturbances that are caused by capacitive couplings and (its clock breakthrough) between external switching signals and the signal node.

BRIEF DESCRIPTION OF THE DRAWINGS

The invention will be explained in more detail in the following text using exemplary embodiments. In the associated drawings:

FIG. 3 shows a photosensor with integrating pixel cells and substrate well and substrate diffusion photodiodes as a light-sensitive element;

FIG. 4 shows a photosensor with integrating pixel cells and dual-junction photodiodes as light-sensitive elements;

DETAILED DESCRIPTION OF ILLUSTRATIVE EMBODIMENTS

Figure 1:
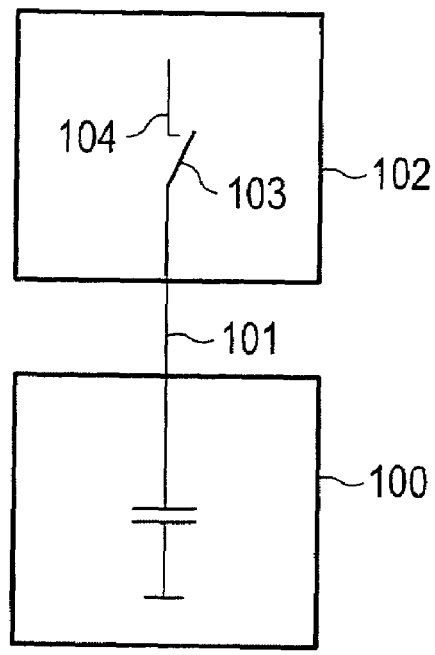
FIG. 1 shows a schematic illustration of a circuit arrangement having a charge-storage element and having an associated reset circuit (prior art)
Figure 2:
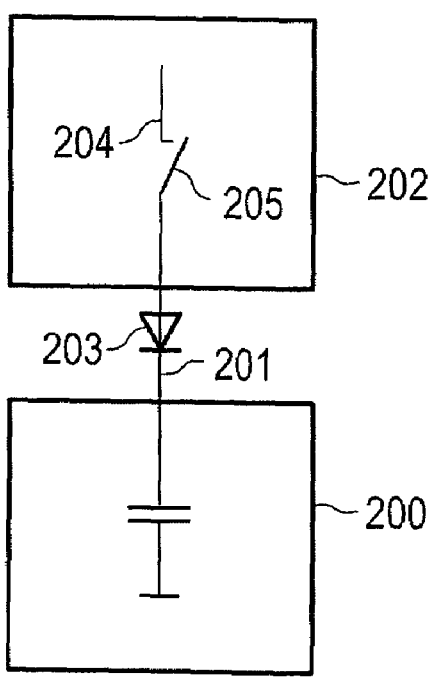
FIG. 2 shows a schematic illustration of a circuit arrangement having a charge-storage element, for example a photodiode, a reset circuit, and a diode connected between them.

FIG. 2 shows a circuit arrangement for setting the initial value on a charge-storage element, which circuit arrangement comprises a charge-storage element 200 (for example a photodiode) with signal node 201. One or more diodes 203 (a charge-receiving element) are coupled to the signal node 201. The other node of the diodes 203 is, in each case, coupled to at least one reset circuit 202. In the reset phase, in which the signal node 201 is reset to the initial value, the connection of the reset circuit 202 is connected to an external reset potential 204 via a reset switch 205.

In this case, the reset circuit 202 is used to separate the analog and digital domains and to provide the capability to adjust the potentials for the required reset and rest phase externally. This makes it possible to prevent disturbances that occur as a result of finite impedances, which generally occur as a result of capacitive couplings (e.g., clock breakthrough). The diodes 203 between the signal nodes 201 and the reset circuits 202 are used to increase the output impedance of the reset circuit 202 during the rest phase.

FIG. 3 relates to a photosensor with integrating pixel cells and substrate well or substrate diffusion photodiodes as light-sensitive elements. In this case, the charge-storage element 301 comprises the depletion layer capacitance of a photodiode. The associated reset circuit 304, controlled by a "RESET" channel reset command, applies an initial potential 305 during the setting phase to the diode 303, which is coupled between the charge-storage element 301 and the reset circuit 304 in the signal node 302. When the diode 303 is forward-biased, a current thus flows through the forward-biased diode 303 to the signal node 302, which is then set to the desired potential.

During the holding phase, the reset circuit 304 applies a rest potential 306 to the diode 303. The rest potential 306 is in this case chosen such that the diode 303 is reverse-biased, thus preventing undesirable current flows between the reset circuit 304 and the signal node 302.

The exemplary embodiment shown in FIG. 4 relates to a photosensor with integrating pixel cells and dual-junction photodiodes as light-sensitive elements. The charge-storage elements in this case comprise the depletion-layer capacitances of two photodiodes 401, 402 connected back-to-back in series. The reset circuit 405, controlled by the signal RESET1, applies an initial potential 407 to the two signal nodes 403, 404 of the charge-storage elements 401, 402 via the diodes 411 and 412 at the start of the setting phase. In this case, the signal node 403 is set to the desired value, and the signal node 404 is set to a provisional initialization value.

The reset circuit 405 then applies the rest potential 408 to the diodes 411, 412. After this, controlled by a signal RESET2, the reset circuit 406 starts to adjust the signal node 404 by applying the initial potential 410 to the diode 413. The potential at the signal node 404 is set by the current flow through the diode 413.

After this initialization, the reset circuit 406 returns to the rest phase, and applies the rest potential 409 to the diode 413. The diodes 411, 412, 413, which are thus reverse-biased, prevent undesirable current flows between the reset circuits 405, 406 and the signal nodes 403, 404, protecting the values in the charge-storage elements (diodes 401, 402).

If the accuracy requirements are not very stringent, the diode 412 may also be omitted, although this configuration does not ensure correct resetting in all situations. However, the positive reset cycle is simplified since the reset circuit 405 and the reset circuit 406 then apply the initial potentials 407, 410 at the same time, and can also return to the rest potential at the same time after the initial values have been set.

Figure 5:
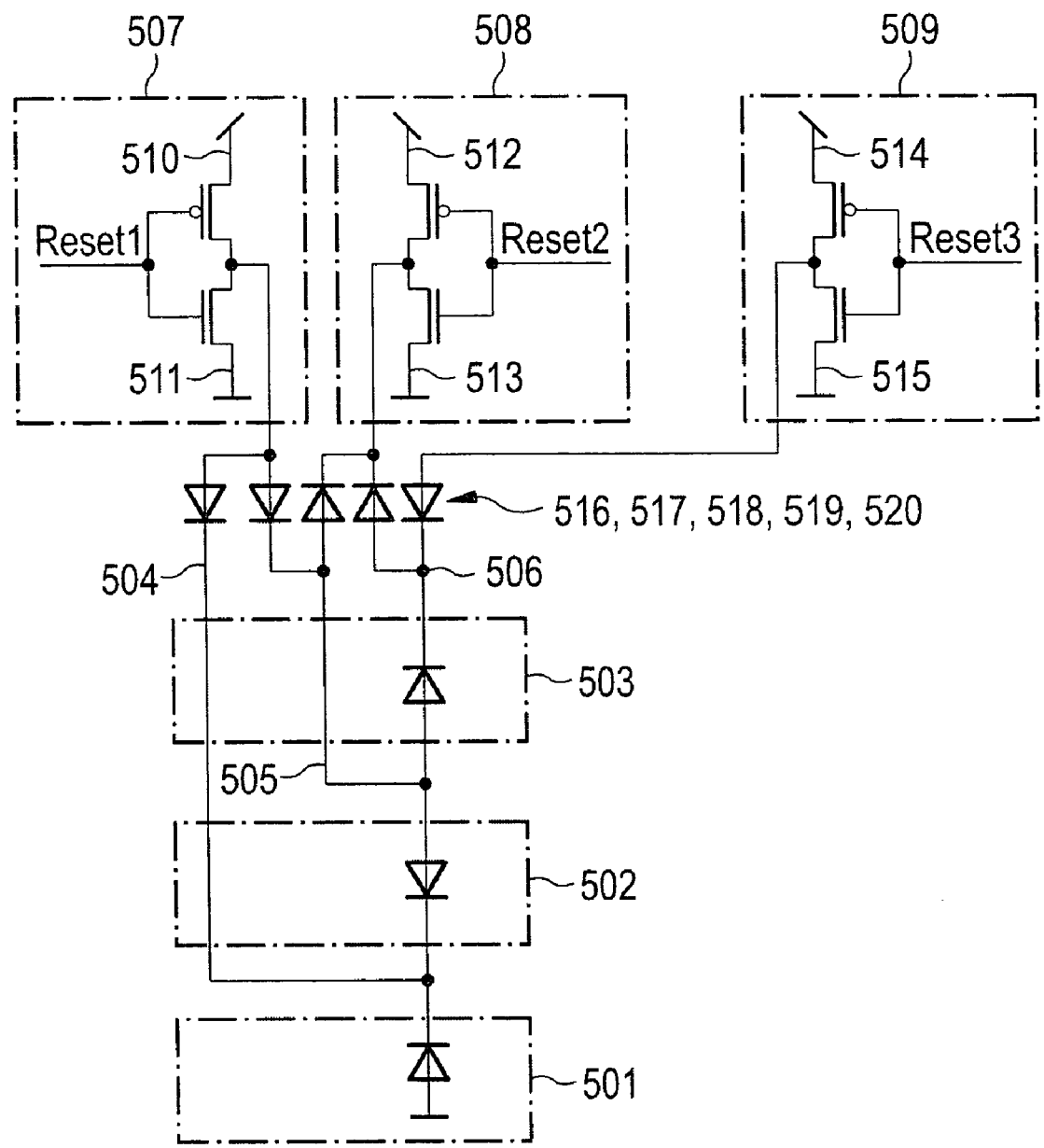
FIG. 5 shows a photosensor with integrating pixel cells and triple-well photo diodes as a light-sensitive element.

In a further exemplary embodiment, as shown in FIG. 5, a photosensor with integrating pixel cells and triple-well photodiodes is provided as a light-sensitive element. In this case, the charge-storage elements comprise depletion-layer capacitances of three photodiodes 501, 502, 503, which are each coupled back-to-back in series and which each have associated reset circuits 507, 508, 509, via diodes 516, 517, 518, 519, 520. The reset circuit 507, controlled by a reset signal, RESET1, applies an initial potential 511 to the diodes 516, 517 at the start of the setting phase. In this case, currents flow through the forward-biased diodes 516, 517, which set the signal nodes 504, 505 to an initial potential.

The signal node 504 is in this case set to the desired value, and the signal node 505 is set to a provisional initialization value. The reset circuit 507 then applies the rest potential 510 to the diodes 516, 517.

Controlled by a signal RESET2, the reset circuit 508 then starts to adjust the signal nodes 505, 506 by applying the initial potential 513 to the diodes 518, 519, which set the signal nodes 505, 506 to an initial potential. The signal node 505 is in this case set to the desired value, and the signal node 506 is set to a provisional initialization value. After this initialization, the reset circuit 508 returns to the rest phase, and applies the rest potential 512 to the diodes 518, 519.

The signal node 506 is now set in a final step. The reset circuit 509 controlled by a signal RESET3, for this purpose applies a setting potential 515 to the diode 520. The reset circuit 509 then returns to the rest potential 515, and applies the rest potential 514 to the diode 520. The diodes 516, 517, 518, 519, 520, which are now reverse-biased, prevent undesirable current flows between the reset circuits 507, 508, 509 and the signal nodes 504, 505, 506, protecting the values in the charge-storage elements (the diodes 501, 502, 503).

Figure 6:
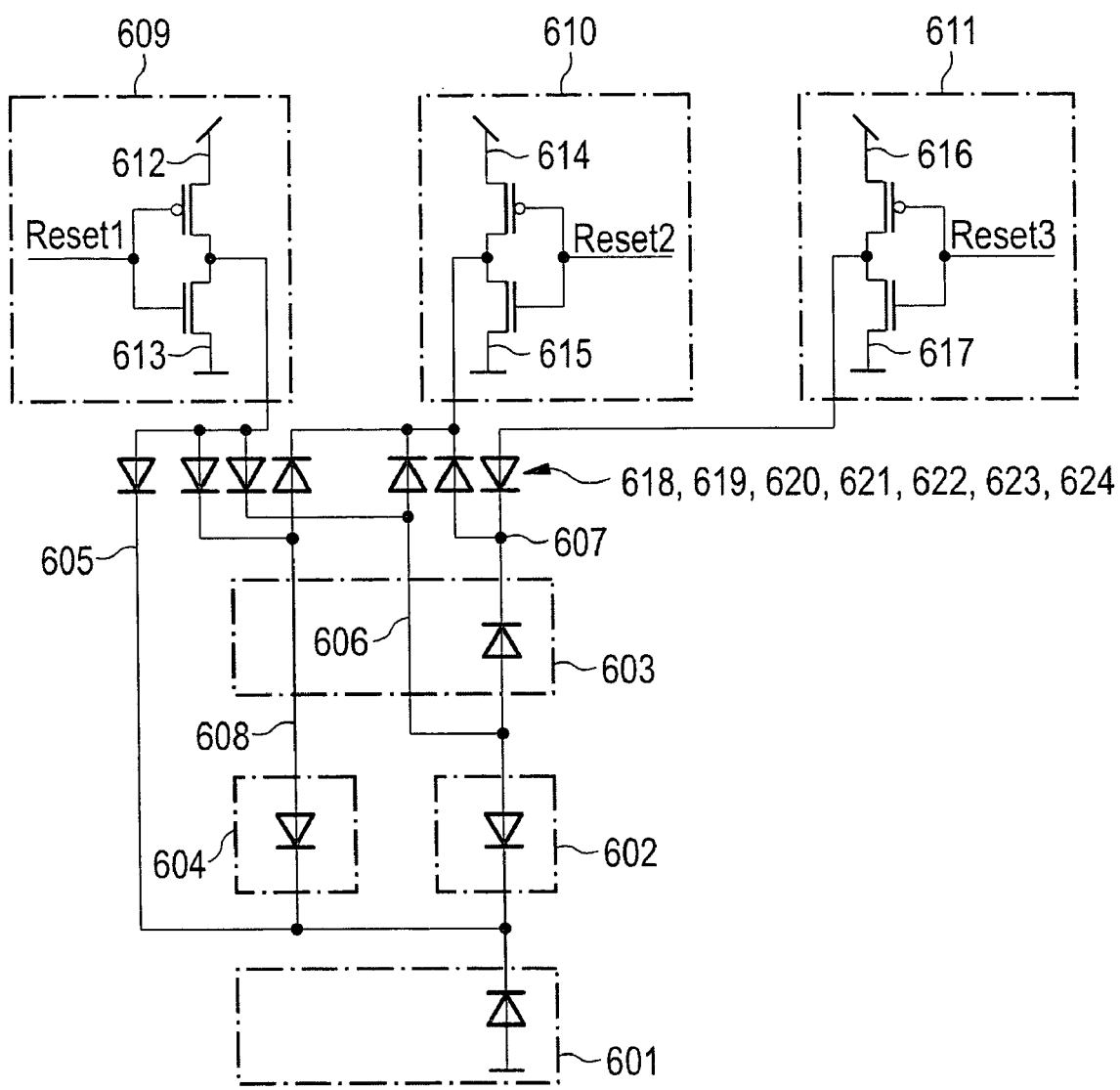
FIG. 6 shows a photosensor with integrating pixel cells and triple-well photodiodes with an additional well diffusion diode as a light-sensitive element.

Finally, FIG. 6 shows a photosensor with integrating pixel cells and triple-well photodiodes with an additional well diffusion photodiode 604 as a charge-storage element, which is initialized to an initial value by means of the diodes 619, 621, analogously to the charge-storage element 602, by application of a reset signal RESET1. The rest of the design and the method of operation correspond to the exemplary embodiment shown in FIG. 5.

In this case, the charge-storage elements comprise depletion-layer capacitances of three photodiodes 601, 602 and 603, which are each connected back-to-back in series, and of the additional well diffusion diode 604, which are each associated with respective reset circuits 609, 610, 611 via diodes 618, 619, 620, 621, 622, 623, 624, 625. Controlled by a reset signal RESET1, the reset circuit 609 applies an initial potential 613 to the diodes 618, 619, 620 at the start of the setting phase. In this case, currents flow through the forward-biased diodes 618, 619, 620 and set the signal nodes 605, 608 and 606 to an initial potential.

The signal node 605 is in this case set to the desired value, and the signal node 608 or 606 is set to a provisional initialization value. The reset circuit 609 then applies the rest potential 612 to the diodes 618, 619, 620.

Controlled by a reset signal RESET2, the reset circuit 610 then starts to adjust the signal nodes 608, 606 by applying the initial potential 615 to the diodes 621, 622, 623, which set the signal nodes 608, 606, 607 to an initial potential. The signal node 608 is in this case set to the desired value, and the signal nodes 606 and 607 are set to a provisional initialization value.

After this initialization, the reset circuit 610 returns to the rest phase, and applies the rest potential 614 to the diodes 618, 619, 620.

The signal node 607 is now set in a final step. Controlled by a reset signal RESET3, the reset circuit 611 for this purpose applies a setting potential 617 to the diode 624. The reset circuit 611 then returns to the rest potential 617, and applies the rest potential 616 to the diode 624. The diodes 618, 619, 620, 621, 622, 623, 624 which are now reverse-biased, prevent undesirable current flows between the reset circuits 609, 610, 611 and the signal nodes 605, 608, 606, 607, protecting the values in the charge-storage elements (the diodes 601, 602, 603, 604).

What is claimed is:

1. A method for setting an initial value on a charge-storage element, the method comprising:
   providing a circuit that includes a charge-storage element with a signal node coupled to an output of a reset circuit that is associated with the charge-storage element, the signal node of the charge storage element being coupled to the output of the reset circuit through a diode so that the signal node is coupled to a first node of the diode and the output is coupled to a second node of the diode;
   initially applying an initial potential to the signal node during a setting phase by connecting the signal node to the initial potential, the initial potential being provided by the reset circuit via the diode; and
   applying a rest potential to the signal node during a subsequent holding phase, the rest potential being provided by the reset circuit via the diode.

2. The method as claimed in claim 1, wherein the signal node comprises a signal node of a plurality of signal nodes located alongside one another in a predetermined sequence, wherein applying an initial potential followed by a rest potential comprises applying the initial potential and the rest potential to two adjacent signal nodes, with the initial potential followed by the rest potential then being applied to the next adjacent signal node that has not had the initial potential applied, wherein application of the initial and rest potentials is continued until a last one of the signal nodes is at the rest potential.

3. The method as claimed in claim 1, wherein the charge-storage element comprises photodiode.

4. The method as claimed in claim 3, wherein the reset circuit comprises at least two switches including a first switch coupled between the initial potential and the diode and a second switch coupled between the rest potential and the diode.

5. The method as claimed in claim 4, wherein the first switch comprises a first transistor and the second switch comprises a second transistor.

6. A circuit arrangement comprising:
   a photodiode having a first node coupled to a reference potential node and a second node;
   a reset device having an input to receive a reset signal and an output; and
   a diode having a first node coupled to the second node of the photodiode and a second node coupled to the output of the reset device so that the diode is coupled in series between the photodiode and the reset device, wherein the reset device provides an initial potential to the photodiode through the diode.

7. The circuit arrangement of claim 6, wherein the reset device comprises a first switch coupled between the diode and the initial potential and a second switch coupled between the diode and a rest potential.

8. The circuit arrangement of claim 7, wherein the first switch comprises a first transistor and the second switch comprises a second transistor.

9. The circuit arrangement of claim 8, wherein the first switch comprises an n-channel MOS transistor and the second switch comprises a p-channel MOS transistor, the first switch and the second switch both having a gate commonly coupled to the reset signal.

10. The circuit arrangement of claim 9, wherein the initial potential comprises a ground potential.

11. The circuit arrangement of claim 7, wherein the diode is coupled so as to allow current to pass when the first switch is closed and the second switch is open and to block current from passing when the first switch is open and the second switch is closed.

12. A circuit arrangement comprising:
   a first photodiode including a first node and a second node;
   a second photodiode including a first node coupled to the second node of the first photodiode and also including a second node;
   a first reset circuit including an output node;
   a second reset circuit including an output node;
   a first diode with a first node coupled to the first node of the first photodiode and a second node coupled to the output node of the second reset circuit;
   a second diode with a first node coupled to the first node of the first photodiode and a second node coupled to the output node of the first reset circuit; and
   a third diode with a first node coupled to the first node of the second photodiode and the second node of the first photodiode, the third diode also having a second node coupled to the output node of the first reset circuit.

13. The circuit arrangement of claim 12, wherein the second diode is oppositely oriented relative to the first diode.

14. The circuit arrangement of claim 12, further comprising:
   a third photodiode including a first node coupled to the second node of the second photodiode and also including a second node;
   a third reset circuit including an output node;
   a fourth diode with a first node coupled to the first node of the second photodiode and the second node of the first photodiode and with a second node coupled to the output node of the third reset circuit; and
   a fifth diode with a first node coupled to the first node of the third photodiode and the second node of the second photodiode and with a second node coupled to the output node of the third reset circuit.

15. The circuit arrangement of claim 14, wherein the second diode is oppositely oriented relative to the first diode and wherein the fourth diode is oppositely oriented relative to the third diode.

16. The circuit arrangement of claim 15, wherein the initial potential comprises a ground potential.

17. The circuit arrangement of claim 14, wherein the second node of the third photodiode is coupled to a ground potential.

18. The circuit arrangement of claim 12, wherein each reset circuit comprises a first switch coupled between the output node and an initial potential and a second switch coupled between the output node and a rest potential.

19. The circuit arrangement of claim 18, wherein the first switch comprises an n-channel MOS transistor and the second switch comprises a p-channel MOS transistor, the first switch and the second switch both having a gate commonly coupled to a reset signal.

20. The circuit arrangement of claim 18, wherein the initial potential is a ground potential and the rest potential is a supply potential greater than the ground potential.

* * * * *